United States Patent
Matsumoto (10) Patent No.: US 8,042,955 B2
(45) Date of Patent: Oct. 25, 2011

(54) LASER MODULE, ILLUMINATION DEVICE, AND PROJECTION DISPLAY DEVICE

(75) Inventor: Shinya Matsumoto, Hirakata (JP)

(73) Assignee: SANYO Electric Co., Ltd., Moriguchi-shi (JP)

( * ) Notice: Subject to any disclaimer, the term of this patent is extended or adjusted under 35 U.S.C. 154(b) by 426 days.

(21) Appl. No.: 12/185,890

(22) Filed: Aug. 5, 2008

(65) Prior Publication Data

US 2009/0040477 A1 Feb. 12, 2009

(30) Foreign Application Priority Data

Aug. 10, 2007 (JP) ................. 2007-209704

(51) Int. Cl.
 *G03B 21/26* (2006.01)
 *F21V 7/04* (2006.01)
(52) U.S. Cl. .................. 353/94; 362/600
(58) Field of Classification Search .......... 353/20, 353/31, 33, 81, 94; 359/618; 372/34; 250/204, 250/205, 552, 553, 578.1, 239.1, 494.1; 257/79–82, 257/88, 89; 348/67, 68; 362/600, 601, 612, 362/559
See application file for complete search history.

(56) References Cited

U.S. PATENT DOCUMENTS

| | | | | |
|---|---|---|---|---|
| 5,084,886 A * | 1/1992 | Martin | ............... | 372/36 |
| 5,532,730 A * | 7/1996 | Akanabe | ............... | 347/259 |
| 5,903,583 A * | 5/1999 | Ullman et al. | ............... | 372/35 |
| 2008/0031289 A1 * | 2/2008 | Cho et al. | ............... | 372/22 |

FOREIGN PATENT DOCUMENTS

| | | |
|---|---|---|
| JP | 11-103132 A | 4/1999 |
| JP | 2006-319011 A | 11/2006 |
| WO | 99/49358 A1 | 9/1999 |

* cited by examiner

*Primary Examiner* — Georgia Y Epps
*Assistant Examiner* — Don Williams
(74) *Attorney, Agent, or Firm* — Marvin A. Motsenbocker; Mots Law, PLLC

(57) ABSTRACT

Disclosed is a light source module including a first light emission unit having a first laser light source, and a first cooling part on which the first laser light source is mounted; a second light emission unit having a second laser light source, and a second cooling part on which the second laser light source is mounted; and an insulating member provided between the first light emission unit and the second light emission unit. The first light emission unit and the second light emission unit are constructed in such a manner that the first laser light source and the second laser light source are disposed close to each other, and the first cooling part and the second cooling part are disposed away from each other.

10 Claims, 10 Drawing Sheets

LASER MODULE, ILLUMINATION DEVICE, AND PROJECTION DISPLAY DEVICE

This application claims priority under 35 U.S.C. Section 119 of Japanese Patent Application No. 2007-209704 filed Aug. 10, 2007, entitled "LASER MODULE, ILLUMINATION DEVICE AND PROJECTION DISPLAY DEVICE".

BACKGROUND OF THE INVENTION

1. Technical Field of the Invention

The present invention relates to a laser module, an illumination device, and a projection display device, and more particularly to an arrangement suitable in attaining high luminance using multiple laser light sources.

2. Disclosure of Related Art

In recent years, development of a projection display device (hereinafter, called as a "projector") incorporated with a solid-state laser light source such as a semiconductor laser has progressed. A laser light source has an excellent performance in rendering a wide color space with high luminance and high precision, and has been noticed as a light emission source for a next-generation projector.

Despite the above demand, the laser light source has a large total heat generation amount, as compared with a lamp, and an output change with respect to a temperature change may easily occur. In view of this, in the case where a laser light source is used, improvement for cooling efficiency and strict temperature control are required. Heretofore, various methods for cooling a laser light source have been proposed. For instance, a laser light source may be cooled by using a heat sink, a Peltier element, or a liquid cooling system.

Also, as a demand for a large-sized screen has been increased in recent years, an increase in light amount has been demanded in an illumination device to be loaded in a projector. The light amount of an illumination device can be increased by arranging laser light sources two-dimensionally or three-dimensionally.

In the case where an edge-emitter semiconductor laser is used as a laser light source, the solid angle of output beam is significantly increased. In view of this, it is required to properly convert laser light into parallel light by a cylindrical lens or a like element to satisfactorily guide the laser light to an optical system (such as a fly-eye lens) provided posterior to the cylindrical lens or the like element. In the above arrangement, since a divergent angle of light in a direction of the longer axis of beam (hereinafter, called as "longer beam axis direction") is large, it is necessary to convert laser light into parallel light at least in the longer beam axis direction.

In the case where an illumination device is constructed by arranging multiple laser light sources, the distance between the laser light sources may be increased in view of a point that a cooling part is mounted to the laser light sources as described above. Therefore, for instance, as shown in FIG. 2B, if illumination light is generated by converting laser light from each laser light source into parallel light by a cylindrical lens or a like element, the size of the generated illumination light may be significantly increased. As a result, an Etendue value of illumination light for incidence onto an optical system provided posterior to the cylindrical lens or the like element may be increased. The above arrangement may cause a drawback that satisfactory projection of illumination light onto an imager (such as a liquid crystal panel) is obstructed, and light use efficiency is lowered.

SUMMARY OF THE INVENTION

A primary object of the invention is to satisfactorily and effectively reduce the size of illumination light, and suppress lowering of the useful life of a laser light source.

A first aspect of the invention is directed to a light source module. The light source module according to the first aspect includes: a first light emission unit including a first laser light source, and a first cooling part on which the first laser light source is mounted; a second light emission unit including a second laser light source, and a second cooling part on which the second laser light source is mounted; and an insulating member provided between the first light emission unit and the second light emission unit. The first light emission unit and the second light emission unit are constructed in such a manner that the first laser light source and the second laser light source are disposed close to each other, and the first cooling part and the second cooling part are disposed away from each other.

The light source module according to the first aspect is advantageous in reducing the distance between the first laser light source and the second laser light source, thereby enabling to suppress an increase in the size of illumination light. Also, since the insulating member is provided between the first light emission unit and the second light emission unit, there is no likelihood that the laser light source may be damaged or broken by energization, even if the first laser light source and the second laser light source are accidentally contacted to each other in position adjustment of each light emission unit. Thereby, lowering of the useful life of the laser light sources can be suppressed.

A second aspect of the invention is directed to an illumination device. The illumination device according to the second aspect includes the light source module according to the first aspect.

A third aspect of the invention is directed to a projection display device. The projection display device according to the third aspect includes the light source module according to the first aspect, or the illumination device according to the second aspect.

A fourth aspect of the invention is directed to an illumination device. The illumination device according to the fourth aspect includes: a first light emission unit including a first laser light source, and a first cooling part on which the first laser light source is mounted; a second light emission unit including a second laser light source, and a second cooling part on which the second laser light source is mounted, the second laser light source being disposed close to the first laser light source, and the second cooling part being disposed away from the first cooling part; an insulating member provided between the first light emission unit and the second light emission unit; a first cylindrical lens for converging laser light to be emitted from the first laser light source in a longer beam axis direction for conversion into parallel light; and a second cylindrical lens for converging laser light to be emitted from the second laser light source in a longer beam axis direction for conversion into parallel light.

In each aspect of the invention, preferably, the insulating member may be mounted on both or one of the first light emission unit and the second light emission unit. The above arrangement enables to properly interpose the insulating member between the first light emission unit and the second light emission unit, even in use of e.g. a film-like member which is easily flexed or deformed as the insulating member, without providing an additional member for holding the insulating member.

BRIEF DESCRIPTION OF THE DRAWINGS

These and other objects, and novel features of the present invention will become more apparent upon reading the following detailed description along with the accompanying drawings.

The drawings are provided mainly for describing the present invention, and do not limit the scope of the present invention.

DESCRIPTION OF PREFERRED EMBODIMENTS

In the following, embodiments of the invention are described referring to the drawings.

First Embodiment

Figure 1A:
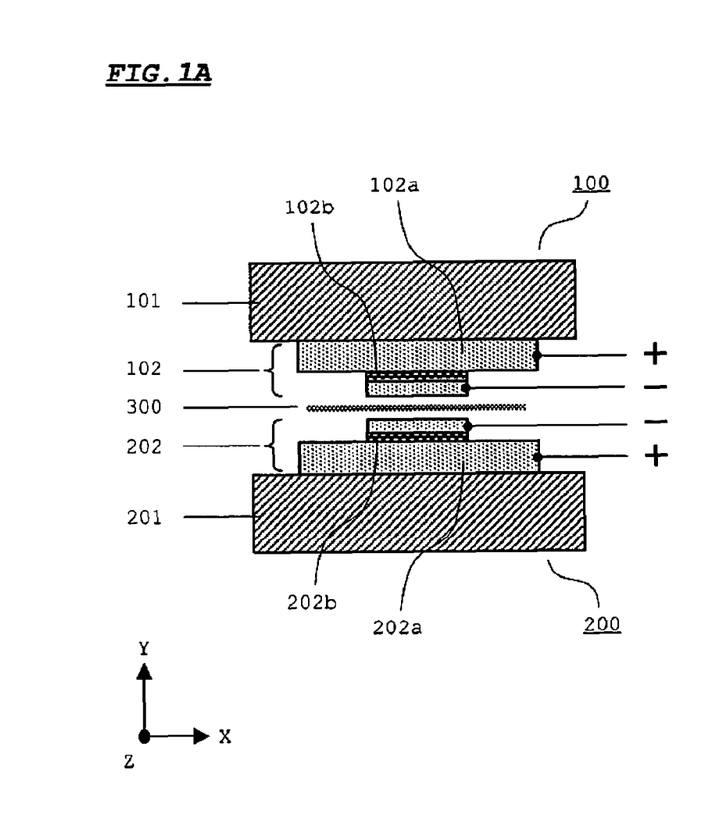
FIGS. 1A and 1B are diagrams showing an arrangement of a light source module in accordance with a first embodiment of the invention.
Figure 1B:
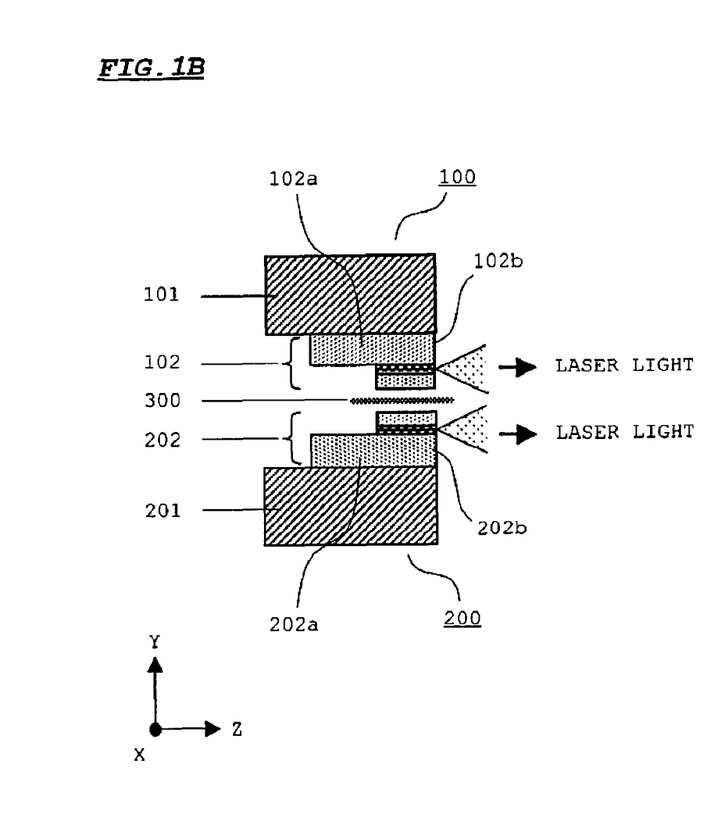

FIGS. 1A and 1B are diagrams showing an arrangement of a light source module in accordance with the first embodiment of the invention. FIG. 1A is a front view of the light source module, and FIG. B is a left side view of the light source module. As shown in FIGS. 1A and 1B, the light source module includes two light emission units 100 and 200. The light emission units 100 and 200 respectively include a cooling part 101 and a laser light source 102, and a cooling part 201 and a laser light source 202. An insulating element 300 is provided between the light emission units 100 and 200.

The cooling part 101, 201 is adapted to remove heat generated in the laser light source 102, 202. The cooling part 101, 201 is constituted of a Peltier element, a structural member (i.e. a liquid cooling jacket) constructed in such a manner that heat is removed by circulation of a cooling liquid, a heat pipe, or a like element; or combination of the above elements. Here, when the cooling part 101, 201 is constituted of a structural unit obtained by placing a Peltier element and a cooling liquid jacket one over the other, or a structural unit obtained by placing a Peltier element and a heat pipe one over the other, it is advantageous in increasing the cooling efficiency with respect to the laser light source 102, 202, and stabilizing the laser output.

The laser light source 102, 202 is constructed by mounting an edge emitter semiconductor laser element 102b, 202b on a substrate (such as a copper plate) 102a, 202a having a high thermal conductivity characteristic and high electrical conductivity. Also, the laser light source 102, 202 is mounted on the cooling part 101, 201 by mounting the substrate 102a, 202a on the cooling part 101, 201.

In this embodiment, the size of the substrate 102a, 202a is set larger than the size of the semiconductor laser element 102b, 202b to increase thermal conductivity with respect to the cooling part 101, 201. The substrate 102a, 202a is mounted on the cooling part 101, 201 by fastening an outer area of the substrate 102a, 202a other than the area, where the semiconductor laser element 102b, 202b is mounted, to the cooling part 101, 201 by e.g. a screw.

In FIGS. 1A and 1B, a bottom surface (corresponding to the substrate side) of the semiconductor laser element 102b, 202b serves as a positive electrode, and a top surface thereof serves as a negative electrode. As shown in FIGS. 1A and 1B, the laser light sources 102 and 202 are arranged in a state that top surfaces thereof are close to each other by mounting the cooling parts 101 and 201 on a holding unit (not shown). The holding unit has an actuator for adjusting the respective positions of the light emission units 100 and 200 in Y-axis direction. Also, laser light is emitted from the laser light source 102, 202 with such a divergent angle that the cross section of light has an elliptical shape. The longer axis and the shorter axis of elliptical beam are respectively aligned in parallel to Y-axis and X-axis in FIGS. 1A and 1B.

The insulating element 300 is constituted of a sheet-like member having a thickness of e.g. about several μm to several hundred μm. In this embodiment, the insulating element 300 is made of a resin material such as a polymer material or a silicone material, or a rubber material. Alternatively, the insulating element 300 may be made of a ceramic material.

In FIGS. 1A and 1B, the insulating element 300 is disposed away from the top surfaces of the semiconductor laser elements 102b and 202b. Alternatively, the insulating element 300 may be attached to the top surface of both or one of the semiconductor laser elements 102b and 202b by an adhesive sheet or a like member. The above arrangement eliminates the need of an additional member for mounting the insulating element 300, which is advantageous in reducing the number of parts and the production cost. The above arrangement is also advantageous in avoiding likelihood that the insulating element 300 may be torn while being pressed by the top surfaces of the semiconductor laser elements 102b and 202b in adjusting the position of the light emission units 101 and 201. Further alternatively, an insulating material may be applied on the top surface of both or one of the semiconductor laser elements 102b and 202b.

Figure 2A:
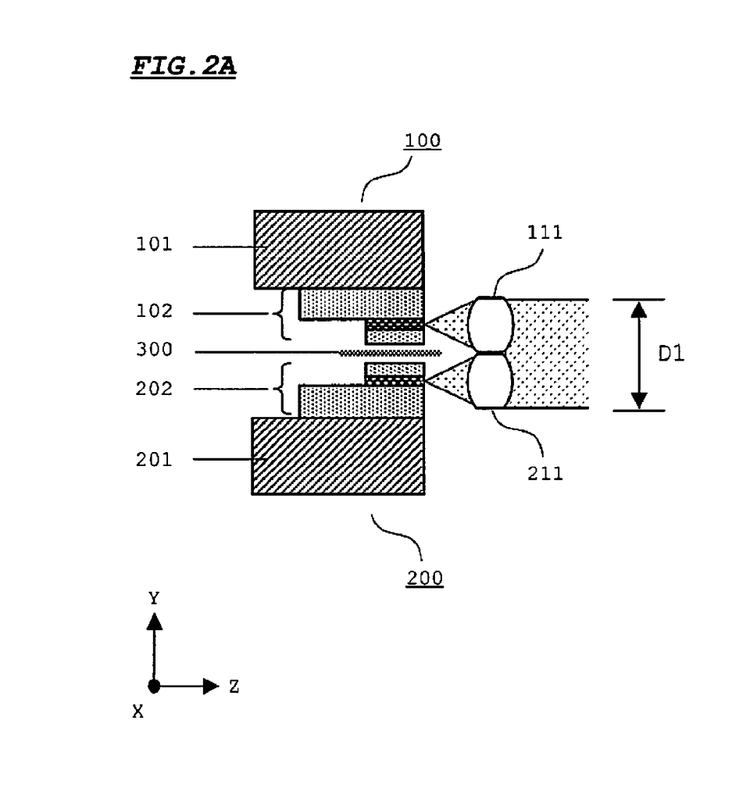
FIGS. 2A and 2B are diagrams for describing an effect of the light source module in accordance with the first embodiment.
Figure 2B:
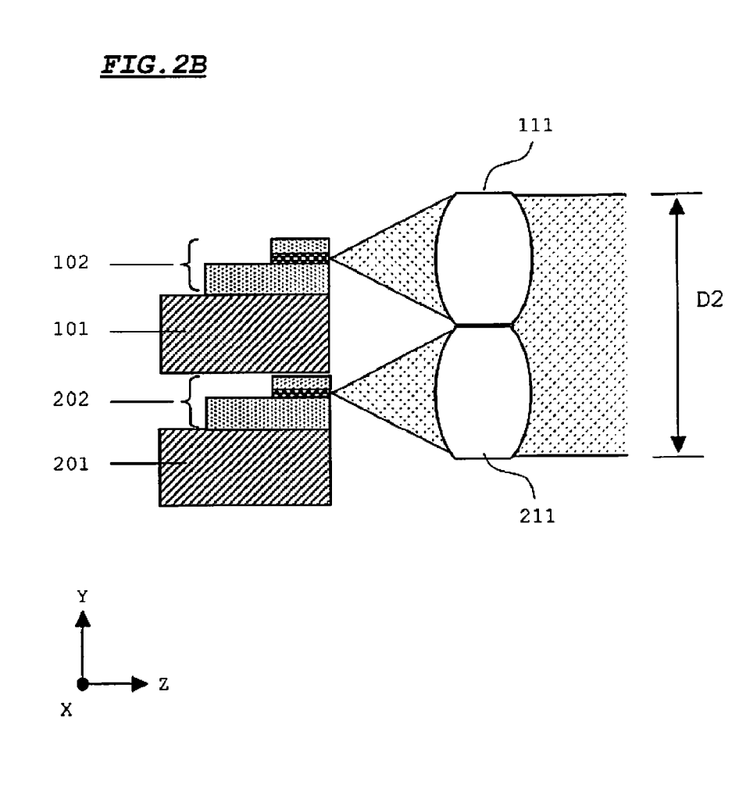

FIG. 2A is a diagram showing an arrangement of an illumination device, wherein cylindrical lenses 111 and 211 are provided in combination with the light source module shown in FIGS. 1A and 1B.

Generally, in an edge emitter semiconductor laser, laser light is emitted with a divergent angle of 80° in the longer beam axis direction and 20° in the shorter beam axis direction. The cylindrical lens 111, 211 converges the laser light emitted from the laser light source 102, 202 in the longer beam axis direction (i.e. Y-axis direction in FIG. 2A) for conversion into parallel light. The laser light which has been converted into parallel light by the cylindrical lenses 111 and 211 is guided to an optical element (such as a fly-eye lens) provided posterior to the cylindrical lenses 111 and 211, as illumination light.

FIG. 2B is a diagram showing an arrangement example in the case where the light emission units 100 and 200 are arranged at such a position that the cooling part 101 and the laser light source 202 are disposed close to each other. In this arrangement, since the cooling part 101 of the light emission unit 100 is interposed between the laser light sources 102 and 202, the distance between the laser light sources 102 and 202 is increased. As a result, the size of the cylindrical lens 111, 211 is increased, and accordingly, the size D2 of illumination light in Y-axis direction is significantly increased.

On the other hand, in this embodiment, as shown in FIG. 2A, the light emission units 100 and 200 are arranged at such a position that the laser light sources 102 and 202 are disposed close to each other. Accordingly, as compared with the arrangement example shown in FIG. 2B, the arrangement shown in FIG. 2A enables to significantly reduce the size of the cylindrical lens 111, 211, and accordingly, significantly reduce the size D1 of illumination light in Y-axis direction. Thereby, an increase in Etendue value of illumination light for incidence onto an optical system provided posterior to the cylindrical lenses 111 and 211 can be suppressed, and use efficiency of illumination light can be increased.

Figure 3A:
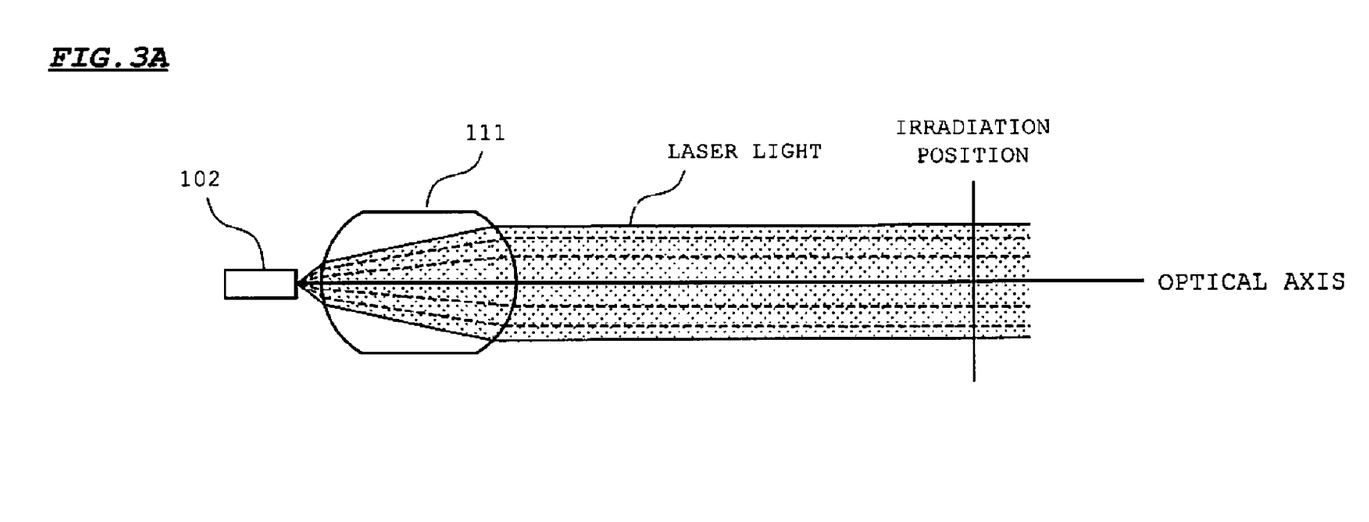
FIGS. 3A and 3B are diagrams for describing a drawback in the case where a laser light source is displaced from a proper position in the first embodiment.
Figure 3B:
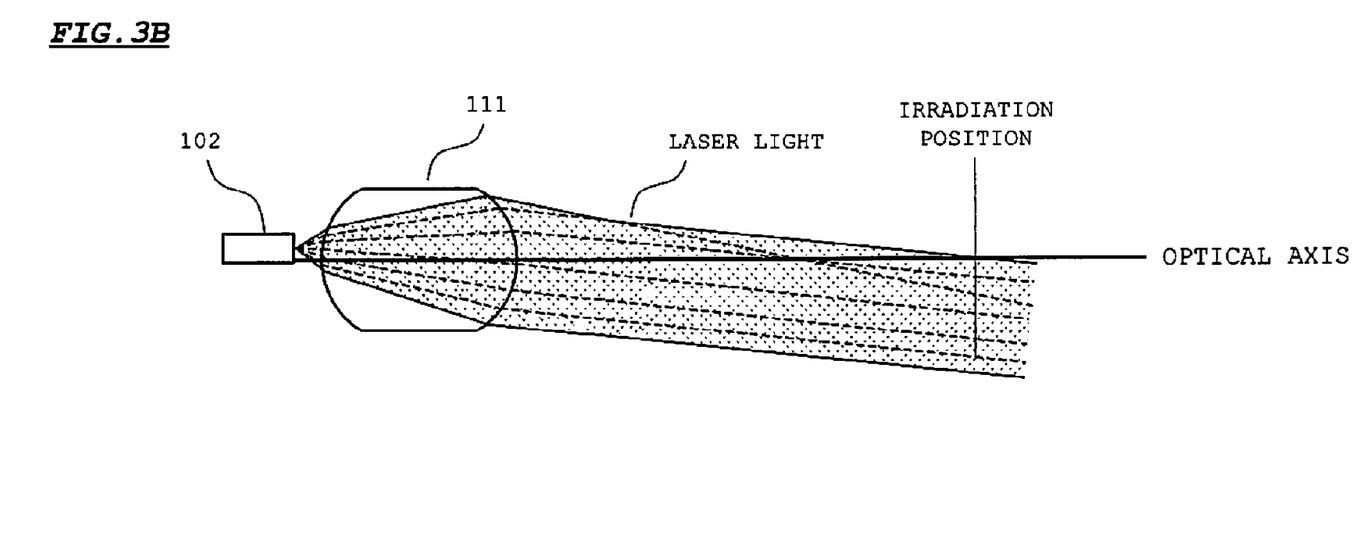

In the case where laser light is converted into parallel light by the cylindrical lens 111, 211, as described in this embodiment, it is necessary to properly define the position of the laser light source 102, 202 with respect to the optical axis of the cylindrical lens 111, 211. FIGS. 3A and 3B are diagrams respectively showing an optical path of laser light in the case where the emission optical axis of the laser light source 102 is aligned with the optical axis of the cylindrical lens 111, and in the case where the emission optical axis of the laser light source 102 is displaced from the optical axis of the cylindrical lens 111. As shown in FIG. 3B, if the emission optical axis of the laser light source 102 is displaced from the optical axis of the cylindrical lens 111, laser light is less likely to be irradiated onto an intended site.

In the above arrangement, a slight displacement of the emission optical axis of the laser light source 102 from the optical axis of the cylindrical lens 111 may greatly displace the irradiation position of laser light with respect to an expected irradiation position. A fly-eye lens is arranged at the irradiation position of laser light. An allowable error of the divergent angle of light to be incident onto the fly-eye lens is several degrees with respect to a proper divergent angle. Accordingly, if the irradiation position of laser light is unduly displaced from the initial irradiation position, the light amount of light to be incident onto the fly-eye lens is significantly reduced, which may significantly lower light use efficiency.

In order to avoid the above drawback, means for adjusting the relative position of the cylindrical lens 111, 211 to the laser light source 102, 202 with high precision is necessary. In this embodiment, the position of the cylindrical lens 111, 211 is fixed, and the position of the laser light source 102, 202 is adjusted by the actuator provided in a holding mechanism. The actuator for position adjustment may be an actuator shown in FIGS. 6A and 6B (to be described in the second embodiment), for example. The actuator is described in detail in the second embodiment, referring to FIGS. 6A and 6B.

Second Embodiment

In the first embodiment, the single semiconductor laser elements 102b and 202b are respectively provided in the laser light sources 102 and 202. In this embodiment, multiple semiconductor laser elements 102b and 202b are respectively provided in laser light sources 102 and 202.

Figure 4A:
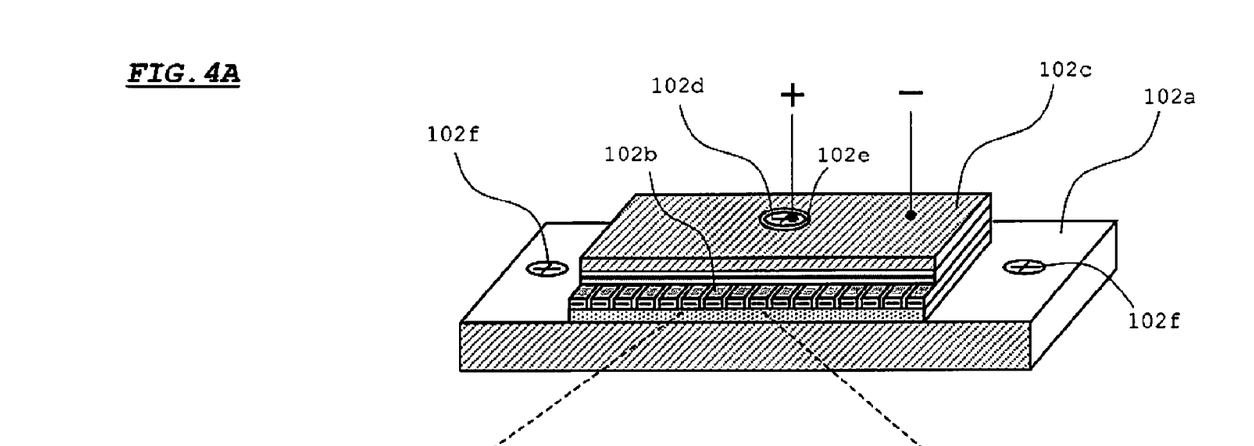
FIGS. 4A and 4B are diagrams showing an arrangement example of a laser light source in accordance with a second embodiment of the invention.
Figure 4B:
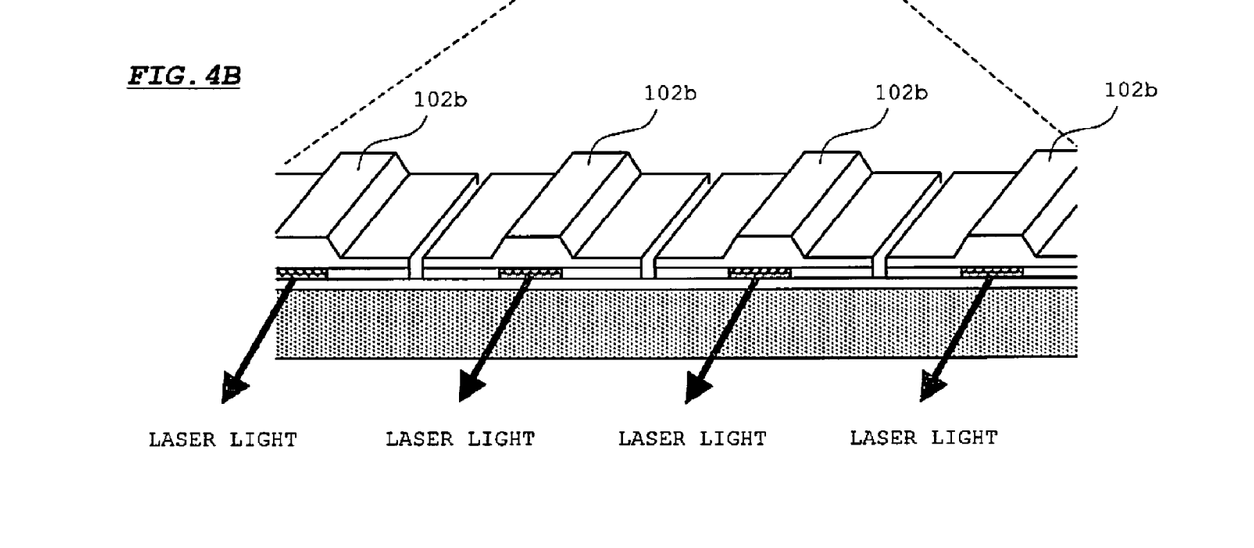

FIG. 4A is a diagram showing an arrangement example of the laser light source 102 in accordance with the second embodiment, and FIG. 4B is a partially enlarged view of FIG. 4A. For simplifying the description, in FIG. 4A, a front part of the laser light source 102 is cut away to see through the semiconductor laser elements 102b. FIGS. 4A and 4B show the arrangement of the laser light source 102. It should be noted that the arrangement of the laser light source 202 is substantially the same as the arrangement of the laser light source 102 shown in FIGS. 4A and 4B.

As shown in FIGS. 4A and 4B, in this embodiment, the laser light source 102 is constructed by forming the multiple semiconductor laser elements 102b in a semiconductor layer. A conductive plate (such as a copper plate) 102c, serving as a negative electrode, is mounted on a top surface of the semiconductor layer. A negative electrode (i.e. a top surface) of each semiconductor laser element 102b is connected to the conductive plate 102c by wire bonding. Also, similarly to the first embodiment, a bottom surface (i.e. a positive electrode) of each semiconductor laser element 102b is mounted on a substrate 102a.

A through-hole to communicate with the substrate 102a is formed in the conductive plate 102c. A conductive screw 102d is engaged with the substrate 102a via the through-hole. With this arrangement, the screw 102d is electrically connected to the positive electrode of each semiconductor laser element 102b. An insulating member 102e is interposed between the screw 102d and the through-hole. A positive potential is supplied to each semiconductor laser element 102b via the screw 102d, and a negative potential is supplied to each semiconductor laser element 102b via the conductive plate 102c.

Similarly to the first embodiment, the size of the substrate 102a is set larger than the size of the semiconductor layer to increase thermal conductivity with respect to a cooling part 101. The substrate 102a is mounted on the cooling part 101 by fastening an outer area of the substrate 102a other than the area, where the semiconductor layer is formed, to the cooling part 101 by a screw 102f.

As described above, in the case where the multiple semiconductor laser elements 102b and 202b are respectively provided in the laser light sources 102 and 202, the cylindrical lens 111 shown in FIG. 2A is configured in such a manner that all the laser light to be emitted from the multiple semiconductor laser elements 102b is uniformly converted into parallel light in the longer beam axis direction; and the cylindrical lens 211 is configured in such a manner that all the laser light to be emitted from the multiple semiconductor laser elements 202b is uniformly converted into parallel light in the longer beam axis direction.

Figure 5A:
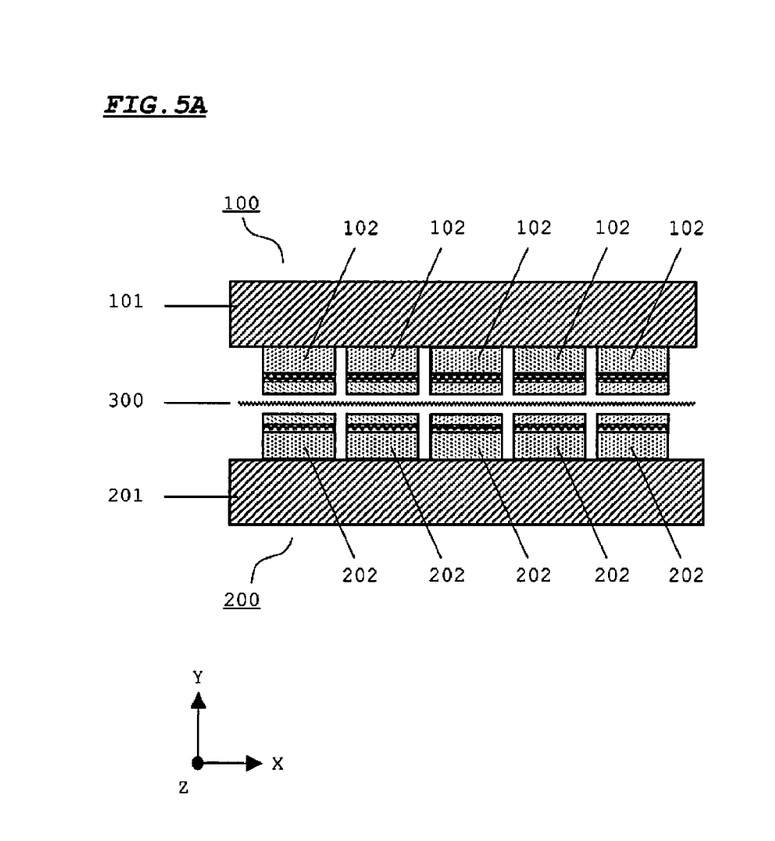
FIGS. 5A and 5B are diagrams showing an arrangement of a light source module in accordance with the second embodiment.
Figure 5B:
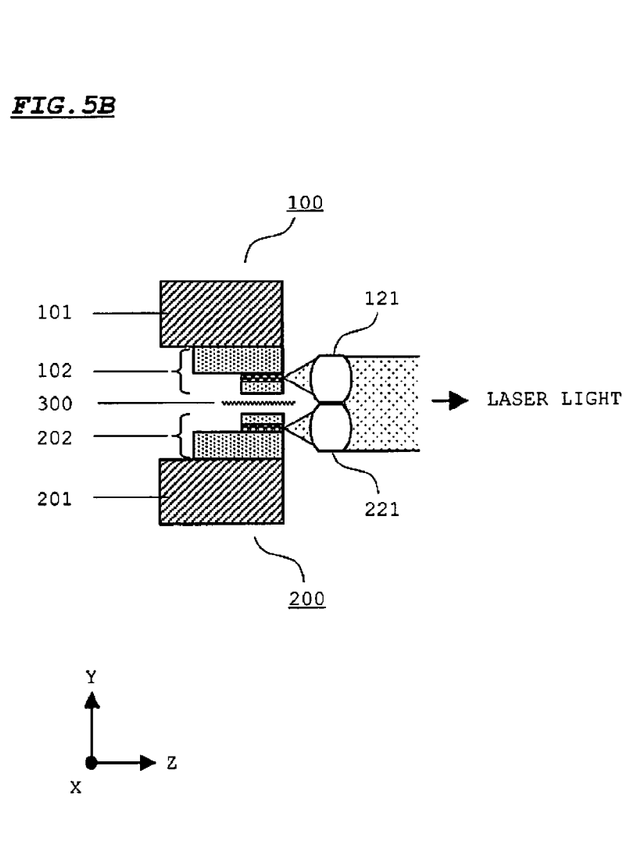

As shown in FIG. 5A, a light source module may be constructed by linearly arranging the laser light source 102, 202 having the arrangement shown in FIGS. 1A and 1B, or the arrangement shown in FIGS. 4A and 4B in the multiple number in X-axis direction. FIG. 5A is a diagram (i.e. a front view) showing an arrangement of the light source module, and FIG. 5B is a diagram (i.e. a left side view) showing an arrangement of an illumination device, wherein cylindrical lenses are provided in combination with the light source module.

As shown in the arrangement example of FIG. 5A, the multiple laser light sources 102, 202 having the arrangement shown in FIGS. 1A and 1B, or the arrangement shown in FIGS. 4A and 4B are linearly arranged in X-axis direction, and the multiple laser light sources 102, 202 are mounted on a cooling part 101, 201. Similarly to the first embodiment, laser light is emitted from each laser light source 102, 202 in such a manner that the longer beam axis direction is aligned with Y-axis direction. In this embodiment, a cylindrical lens 121 is provided to uniformly convert laser light to be emitted from all the laser light sources 102 on the side of the light emission unit 100 into parallel light. Likewise, a cylindrical lens 221 is provided to uniformly convert laser light to be emitted from all the laser light sources 202 on the side of the light emission unit 200 into parallel light.

An insulating element 300 is provided between all the laser light sources 102 on the side of the light emission unit 100, and all the laser light sources 202 on the side of the light emission unit 200. Similarly to the first embodiment, the insulating element 300 may be attached to both or one of each laser light source 102 and each laser light source 202 by way of an adhesive sheet or a like member, or an insulating material may be applied to a top surface of both or one of each laser light source 102 and each laser light source 202.

Figure 6A:
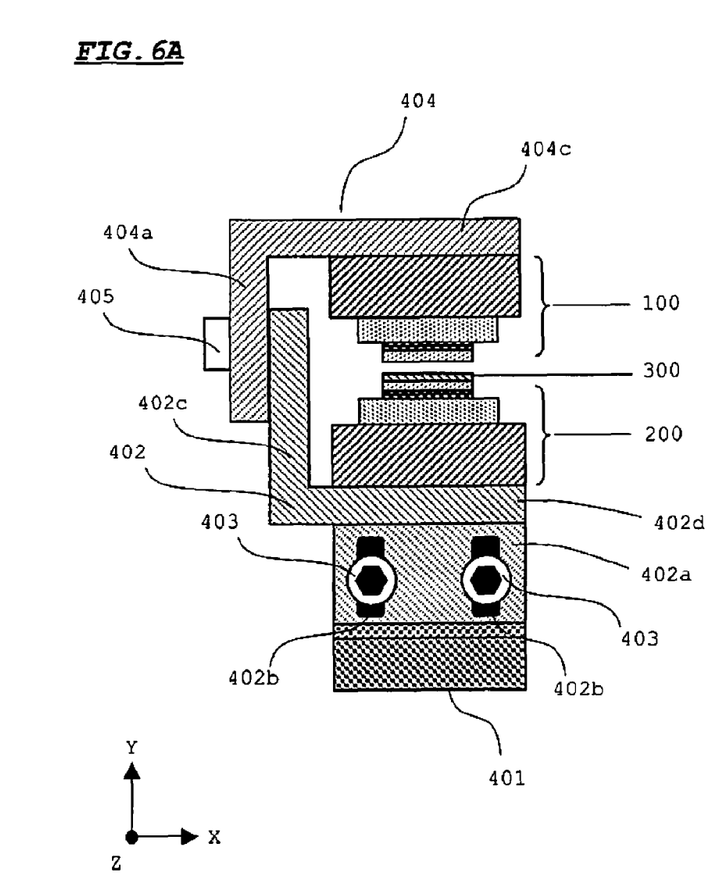
FIGS. 6A and 6B are diagrams showing an arrangement of a holding unit in accordance with the second embodiment.
Figure 6B:
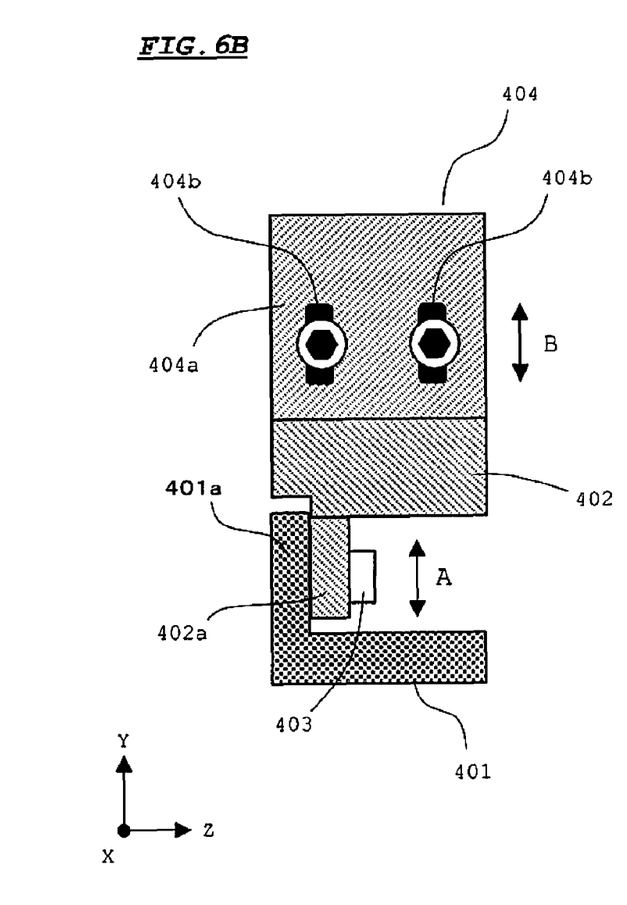

FIGS. 6A and 6B are diagrams showing an arrangement of a holding unit for holding the light emission units 100 and 200. FIG. 6A is a front view of the holding unit, and FIG. 6B is a left side view of the holding unit. In FIGS. 6A and 6B, the insulating element 300 is provided on the respective top surfaces of the laser light sources 202 on the side of the light emission unit 200. In this arrangement, in the case where the light emission unit 200 has the arrangement shown in FIGS. 4A and 4B, the insulating element 300 is formed by e.g. connecting the conductive plate 102c and the screw 102d to respective corresponding leading wires, and then applying an insulating material on the entire area (including a portion corresponding to the screw 102d) of the top surface of the conductive plate 102c.

As shown in FIGS. 6A and 6B, the holding unit is constituted of a base block 401, a first movable frame 402, screws 403, a second movable frame 404, and screws 405. The base block 401 has an L-shape in cross section, wherein screw holes (not shown) each engageable with the corresponding screw 403 are formed in a wall 401a. A wall 402a is formed on a lower surface of the first movable frame 402 and extends downwardly. Two guide holes 402b extending in vertical directions are formed in the wall 402a. The width of each guide hole 402b is set slightly larger than the diameter of a screw portion of the screw 403.

The two screws 403 are respectively engaged in the screw holes on the wall 401a via the guide holes 402b. Fastening the two screws 403 enables to fix the first movable frame 402 with respect to the base block 401. Also, unfastening the two screws 403 allows displacement of the first movable frame 402 with respect to the base block 401 in vertical directions (i.e. in the directions shown by the arrows A in FIG. 6B).

A wall 402c is formed on a side portion of the first movable frame 402 and extends in Y-axis direction. Two screw holes (not shown) respectively engageable with the two screws 405 are formed in the wall 402c. The second movable frame 404 is mounted on the first movable frame 402 by the screws 405.

The second movable frame 404 has an L-shape in cross section, wherein two guide holes 404b extending in vertical directions are formed in a wall 404a. The width of each guide hole 404b is set slightly larger than the diameter of a screw portion of the screw 405.

The two screws 405 are respectively engaged in the screw holes on the wall 402c via the guide holes 404b. Fastening the two screws 405 enables to fix the second movable frame 404 with respect to the first movable frame 402. Also, unfastening the two screws 405 allows displacement of the second movable frame 404 with respect to the first movable frame 402 in vertical directions (i.e. in the directions shown by the arrows B in FIG. 6B).

The light emission unit 100 is mounted on a lower surface of a holding plate portion 404c of the second movable frame 404. Likewise, the light emission unit 200 is mounted on an upper surface of a holding plate portion 402d of the first movable frame 402. The lower surface of the holding plate portion 404c and the upper surface of the holding plate portion 402d are aligned in parallel to a horizontal direction (i.e. X-Z plane direction).

The position of the light emission unit 100, 200 with respect to the cylindrical lens 111, 211 shown in FIG. 2B is adjusted by e.g. the following steps. First, after the base block 401 is mounted at a predetermined site in a light source device, the first movable frame 402 is brought to a movable state by unfastening the two screws 403, and the position of the light emission unit 200 is adjusted with respect to the cylindrical lens 211. Then, the two screws 403 are fastened in a state that the light emission unit 200 is in a proper position, and the first movable frame 402 is fixed. Subsequently, the second movable frame 404 is brought to a movable state by unfastening the two screws 405, and the position of the light emission unit 100 is adjusted with respect to the cylindrical lens 111. Then, the two screws 405 are fastened in a state that the light emission unit 100 is in a proper position, and the second movable frame 404 is fixed. Thus, the position adjustment of the light emission unit 100, 200 with respect to the cylindrical lens 111, 211 is completed.

In this embodiment, two light emission units each of which is constituted of linearly arranged multiple laser light sources are arranged at such a position that the laser light sources of the two light emission units are disposed close to each other. As compared with the first embodiment, the above arrangement enables to realize an illumination device having a higher density and a smaller Etendue value. Also, since an insulating element is interposed between each laser light sources of the two light emission units, there is no likelihood that the vertically opposing laser light sources may be electrically contacted in position adjustment of the laser light sources with respect to the corresponding cylindrical lens, or a like operation. Accordingly, the above arrangement enables to suppress lowering of the useful life of the laser light sources resulting from unwanted electric contact.

In the arrangement example of FIGS. 6A and 6B, the first movable frame 402 and the second movable frame 404 are fixed by fastening the screws 403 and the screws 405 in Z-axis direction and X-axis direction, respectively. The fastening directions of the screws 403 and the screws 405 are not limited to the above, but may be properly changed depending on a modification in structure of the first movable frame 402 and the second movable frame 404. It is necessary, however, to configure the first movable frame 402, the second movable frame 404 into such a structure as to avoid blocking of laser light to be emitted from the light emission unit 100, 200.

Third Embodiment

The third embodiment is directed to an arrangement example of an illumination device for generating illumination light by combining multiple light source modules.

FIGS. 7A through 7D are diagrams showing an arrangement of the illumination device. FIGS. 7A, 7B, 7C, and 7D are respectively a top plan view, a rear view (i.e. a diagram of FIG. 7A viewed from the direction of the arrow P), a left side view (i.e. a diagram of FIG. 7A viewed from the direction of the arrow Q), and a right side view (i.e. a diagram of FIG. 7A viewed from the direction of the arrow R) of the illumination device.

The illumination device in the third embodiment includes six light source modules 10, 20, 30, 40, 50, and 60; six cylindrical lenses 11, 21, 31, 41, 51, and 61 disposed in correspondence to the respective light source modules 10, 20, 30, 40, 50, and 60; lens holding members 71, 72, and 73 for respectively fixing and holding the cylindrical lenses 11 and 31, 21 and 41, and 51 and 61 in the illumination device; a prism mirror 81 for reflecting laser light from the light source modules 10 and 20 in a front direction; and a prism mirror 82 for reflecting laser light from the light source modules 30 and 40 in a front direction.

Similarly to the first embodiment or the second embodiment, in the light source module 10, 20, 30, 40, 50, 60, two light emission units are arranged at such a position that laser light sources of the two light emission units are disposed close to each other via an insulating element. The light source module 10, 20, 30, 40, 50, 60 has a holding unit substantially the same as the holding unit shown in FIGS. 6A and 6B. The light source modules 10, 20, 30, 40, 50, and 60 are arranged at such a position that laser light from each light source module after transmission through the corresponding cylindrical lens does not overlap each other, and is not blocked by the prism mirrors 81 and 82.

The cylindrical lenses 11, 21, 31, 41, 51, and 61 convert laser light from the two light emission units each constituting the light source module 10, 20, 30, 40, 50, 60 into parallel light in the longer beam axis direction. Whereas in the first and the second embodiments, two individual cylindrical lenses are necessary for two light emission units constituting one light source module, in the third embodiment, two cylindrical lenses are integrally formed.

The lens holding member 71 disposes the cylindrical lenses 11 and 31 at a predetermined position within the light source device, while holding the cylindrical lenses 11 and 31. The lens holding member 72 disposes the cylindrical lenses 21 and 41 at a predetermined position within the light source device, while holding the cylindrical lenses 21 and 41. The lens holding member 73 disposes the cylindrical lenses 51 and 61 at a predetermined position within the light source device, while holding the cylindrical lenses 51 and 61.

Figure 7A:
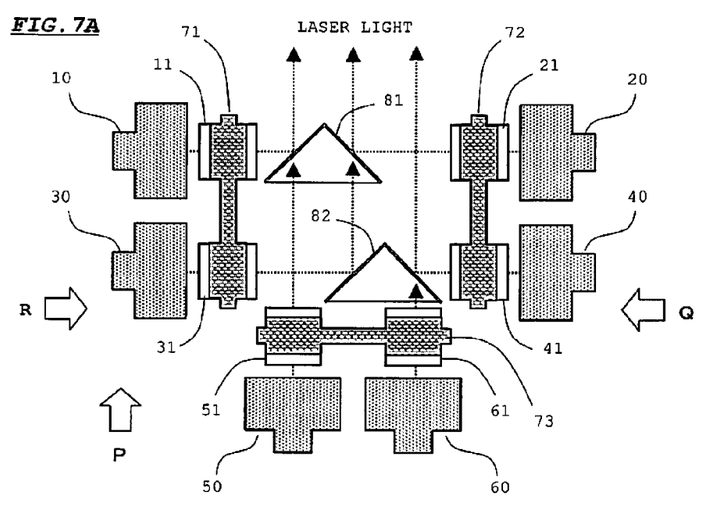
FIGS. 7A through 7D are diagrams showing an arrangement of a light source device in accordance with a third embodiment of the invention.
Figure 7B:
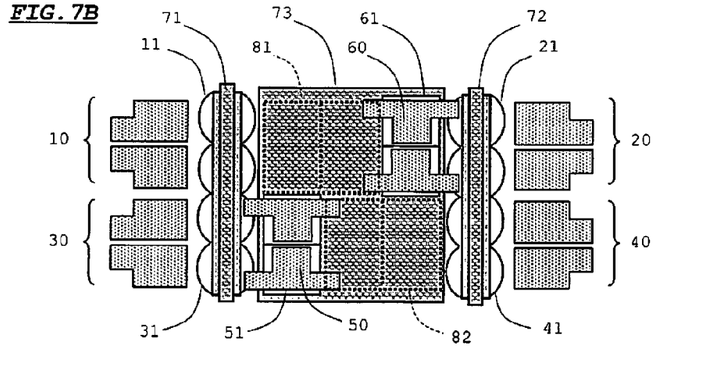
Figure 7C:
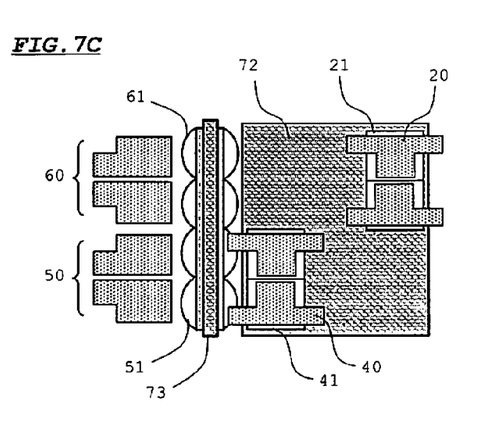
Figure 7D:
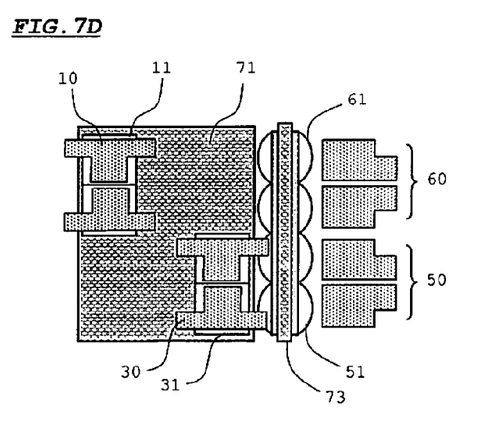

The light source modules 10 and 20 face each other. The prism mirror 81 is arranged on an optical path of laser light from the light source modules 10 and 20. As shown in FIG. 7B, the prism mirror 81 is arranged at a position displaced in leftward direction with respect to the arranged position of the light source module 60 and the cylindrical lens 61, as viewed from a rear side of the illumination device. Laser light emitted from the light source module 10, 20 is converted into parallel light by the cylindrical lens 11, 21, and then, is reflected in a front direction by a corresponding mirror surface of the prism mirror 81.

The light source modules 30 and 40 face each other. The prism mirror 82 is arranged on an optical path of laser light from the light source modules 30 and 40. As shown in FIG. 7B, the prism mirror 82 is arranged at a position displaced in rightward direction with respect to the arranged position of the light source module 50 and the cylindrical lens 51, as viewed from the rear side of the illumination device. Laser light emitted from the light source module 30, 40 is converted into parallel light by the cylindrical lens 31, 41, and then, is reflected in a front direction by a corresponding mirror surface of the prism mirror 82.

As shown in FIG. 7B, laser light from the laser module 60 is converted into parallel light by the cylindrical lens 61, and then, propagates in forward direction while passing through a space defined in the right side of the prism mirror 81, as viewed from the rear side of the illumination device. Likewise, laser light from the laser module 50 is converted into parallel light by the cylindrical lens 51, and then, propagates in forward direction while passing through a space defined in the left side of the prism mirror 82, as viewed from the rear side of the illumination device.

Figure 8A:
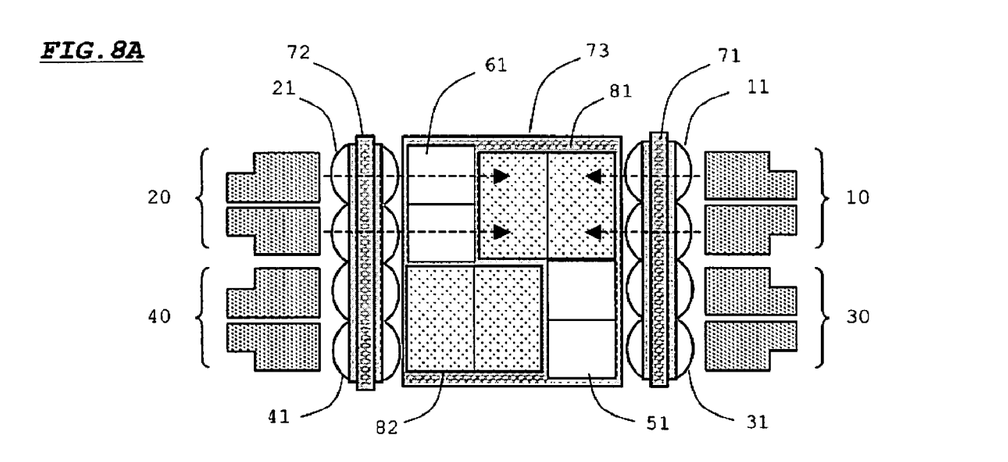
FIGS. 8A through 8C are diagrams for describing an operation of the light source device in accordance with the third embodiment.
Figure 8B:
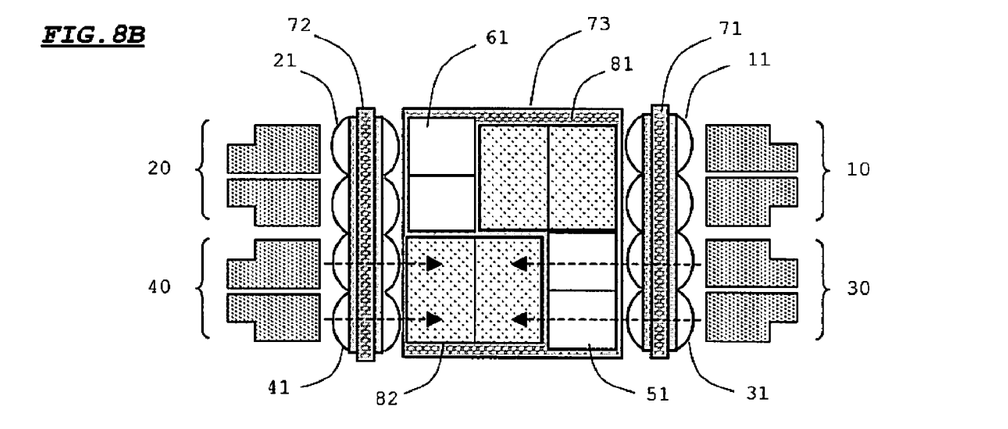
Figure 8C:
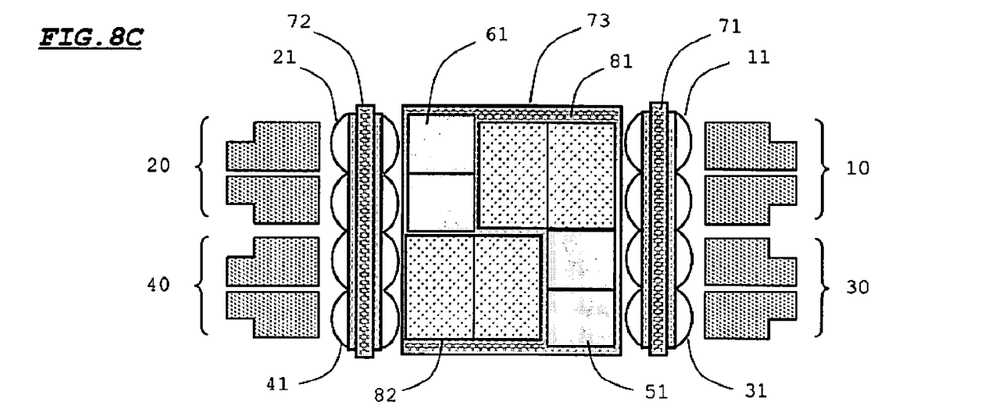

FIGS. 8A through 8C are diagrams of the illumination device viewed from a front side of the illumination device.

Referring to FIG. 8A, laser light emitted from the laser modules 10 and 20 is guided to respective two mirror surfaces of the prism mirror 81 through the cylindrical lenses 11 and 21, reflected thereon, and guided in forward direction. Referring to FIG. 8B, laser light emitted from the laser modules 30 and 40 is guided to respective two mirror surfaces of the prism mirror 82 through the cylindrical lenses 31 and 41, reflected thereon, and guided in forward direction. Referring to FIG. 8C, laser light emitted from the laser modules 50 and 60 (not shown in FIG. 8C) is transmitted through the cylindrical lenses 51 and 61, and then, guided in forward direction while passing through the right-side space of the prism mirror 82 and the left-side space of the prism mirror 81, respectively.

As described above, laser light emitted from the light source modules 10, 20, 30, 40, 50, and 60 is respectively guided in a front direction of the illumination device, while passing through the prism mirrors 81 and 82, or without passing through the prism mirrors 81 and 82, thereby generating illumination light as the whole.

Figure 9:
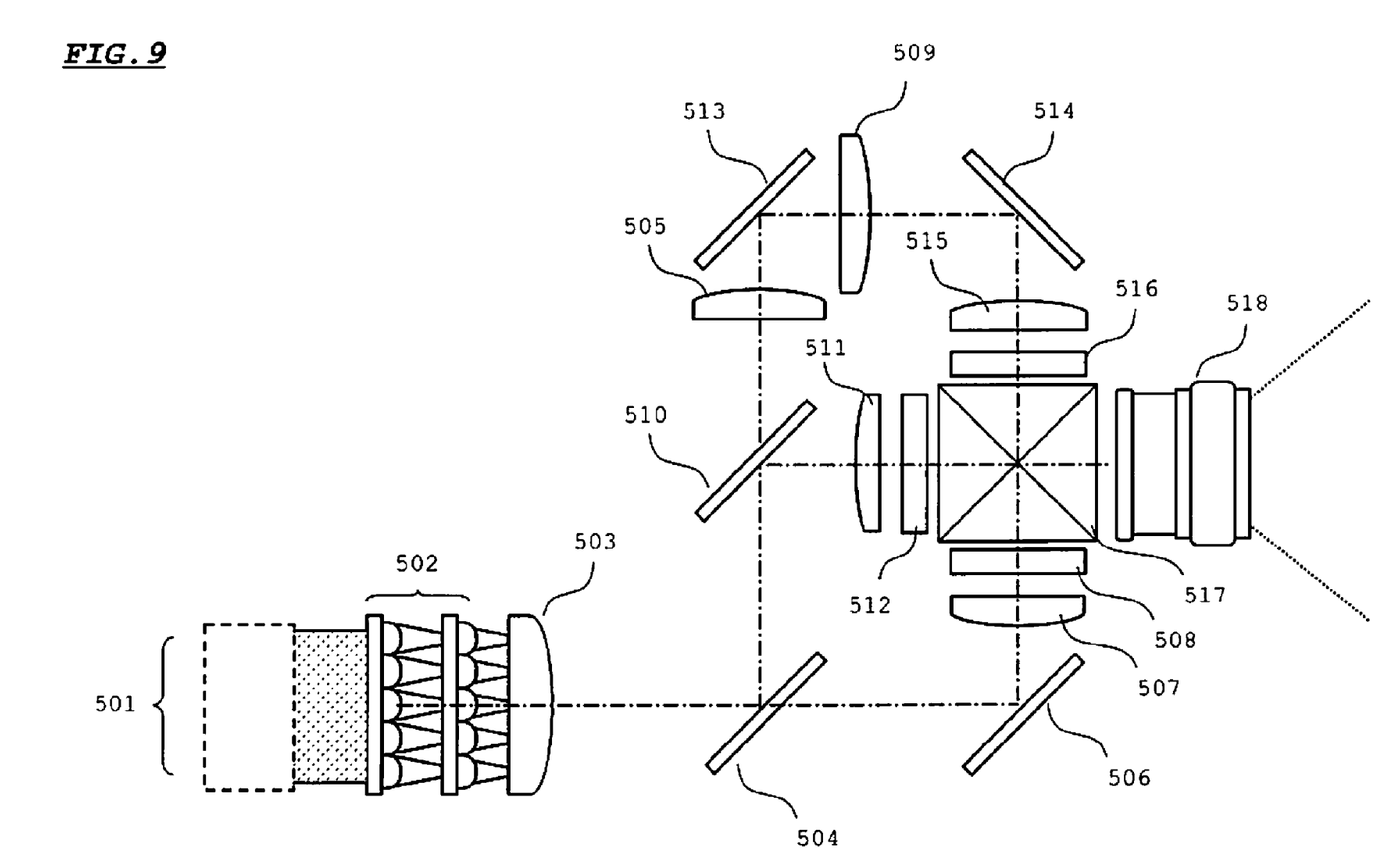
FIG. 9 is a diagram showing an optical system for a projector in accordance with the third embodiment.

FIG. 9 is a diagram showing an optical system for a projector loaded with the illumination device in the third embodiment. In FIG. 9, the reference numeral 501 indicates the illumination device in accordance with the third embodiment. Laser light sources for respectively emitting laser light having a red wavelength band, a blue wavelength band, and a green wavelength band are provided in the illumination device 501. In this arrangement, the illumination device 501 emits laser light in a condition that different colors are combined. In this embodiment, in the light source module 10, 20, 30, 40, 50, 60 shown in FIGS. 7A through 7D, and FIGS. 8A through 8C, laser light sources for emitting light of an identical color may be arranged, or laser light sources for emitting light of different colors may be arranged.

Light from the illumination device 501 is incident onto a condenser lens 503 via a fly-eye lens 502. The fly-eye lens 502 includes multiple lens cells arranged in a fly-eye pattern. The fly-eye lens 502 is adapted to superimpose light from the illumination device 501 in such a manner that the light amount distributions with respect to incidence onto liquid crystal panels 508, 512, and 516 are substantially made uniform.

Light condensed by the condenser lens 503 is incident onto a dichroic mirror 504. The dichroic mirror 504 transmits only light (hereinafter, called as "R light") having a red wavelength band, among the light incident from the condenser lens 503, and reflects light (hereinafter, called as "B light") having a blue wavelength band and light (hereinafter, called as "G light") having a green wavelength band.

The R light transmitted through the dichroic mirror 504 is guided to the liquid crystal panel 508 via a mirror 506 and a lens 507. An unillustrated incident-side polarizer is arranged on the incident side of the liquid crystal panel 508. The liquid crystal panel 508 is driven in accordance with a video signal for red color to modulate R light depending on a driving condition of the liquid crystal panel 508. The R light modulated by the liquid crystal panel 508 is incident onto a dichroic prism 517 via an output-side polarizer (not shown).

The B light and the G light reflected on the dichroic mirror 504 are incident onto a dichroic mirror 510. Among the B light and the G light, the G light is reflected on the dichroic mirror 510 for incidence onto a lens 511. Thereafter, the G light is incident onto the liquid crystal panel 512 via an incident-side polarizer (not shown). The liquid crystal panel 512 is driven in accordance with a video signal for green color to modulate G light depending on a driving condition of the liquid crystal panel 512. The G light modulated by the liquid crystal panel 512 is incident onto the dichroic prism 517 via an output-side polarizer (not shown).

The B light transmitted through the dichroic mirror 510 is incident onto a lens 515 via two lenses 505 and 509, and two mirrors 513 and 514. Thereafter, the B light is incident onto the liquid crystal panel 516 via an incident-side polarizer (not shown). The liquid crystal panel 516 is driven in accordance with a video signal for blue color to modulate B light depending on a driving condition of the liquid crystal panel 516. The B light modulated by the liquid crystal panel 516 is incident onto the dichroic prism 517 via an output-side polarizer (not shown).

The dichroic prism 517 combines the R light, the G light, and the B light that have been modulated by the liquid crystal panels 508, 512, and 516 for incidence onto a projection lens 518. The projection lens 518 includes a lens group for focusing projection light on a projection plane, and an actuator for controlling a zoom condition and a focus condition of a projected image by displacing a part of the lens group in an optical axis direction. Color image light obtained by color combination by the dichroic prism 517 is enlarged and projected on a screen by the projection lens 518.

In the arrangement example of FIG. 9, a transmissive liquid crystal panel is used as the imager. Alternatively, an optical system incorporated with a reflective liquid crystal panel may be used.

Figure 10:
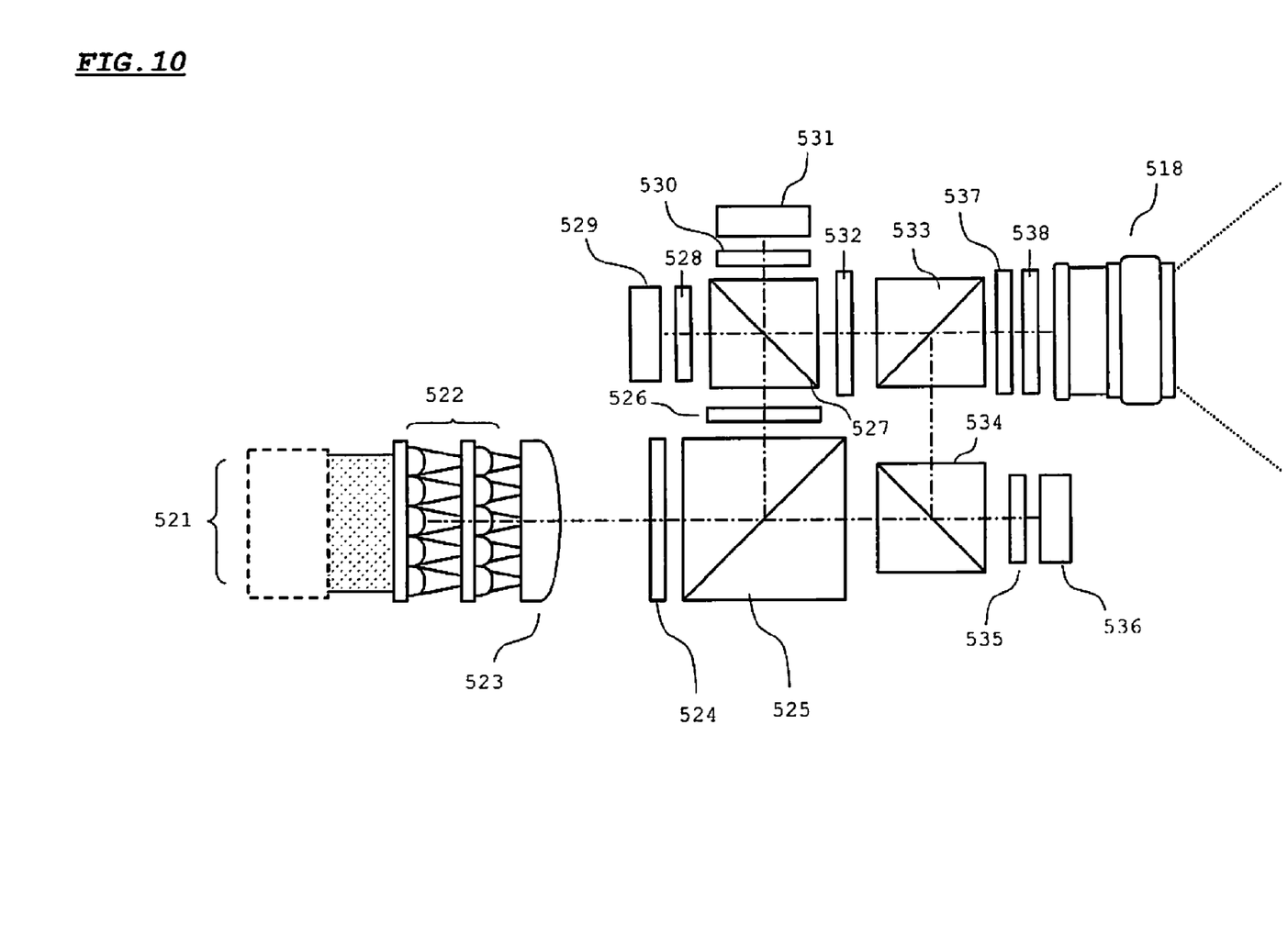
FIG. 10 is a diagram showing a modification example of the optical system for the projector in accordance with the third embodiment.

FIG. 10 is a diagram showing an arrangement example using a reflective liquid crystal panel. In FIG. 10, the arrangement from an illumination device 521 to a condenser lens 523 is substantially the same as the arrangement from the illumination device 501 to the condenser lens 503 in FIG. 9.

Light transmitted through the condenser lens 523 is S-polarized light with respect to a polarizing plane of a polarized beam splitter (PBS) 525. Among the S-polarized light, G light is converted into P-polarized light by a half-wavelength plate 524 having wavelength selectivity. Accordingly, the G light is transmitted through the PBS 525, and B light and R light are reflected on the PBS 525.

Among the B light and the R light reflected on the PBS 525, the R light is converted into P-polarized light by a half-wavelength plate 526 having wavelength selectivity. Accordingly, among the B light and the R light, the B light is reflected on a PBS 527, and the R light is transmitted through the PBS 527.

The B light reflected on the PBS 527 is converted into circularly-polarized light by a quarter wavelength plate 528 for incidence onto a reflective liquid crystal panel 529. In this arrangement, for instance, the rotating direction of circularly-polarized B light is inverted merely at a pixel position in an on-state by reciprocating movement of B light with respect to the liquid crystal panel 529. Accordingly, when the B light is transmitted through the quarter wavelength plate 528 again, the B light is converted into P-polarized light at the pixel position in an on-state, and is converted into S-polarized light at the pixel position in an off-state. Among the B light, merely the P-polarized light with respect to the pixel position in an on-state is transmitted through the PBS 527 for incidence onto a PBS 533 via a half wavelength plate 532 having wavelength selectivity.

Similarly, among the R light transmitted through the PBS 527 after transmittance through the half wavelength plate 526, merely a light component corresponding to the pixel position in an on-state is reflected on the PBS 527, and guided to the half wavelength plate 532 having wavelength selectivity by reciprocating movement of light between a quarter wavelength plate 530 and a reflective liquid crystal panel 531.

The R light is converted into P-polarized light by the half wavelength plate 532 having wavelength selectivity for incidence onto the PBS 533.

As described above, both of the B light and the R light that have been modulated by the liquid crystal panels 529 and 531 are incident onto the PBS 533 in identical polarization directions. In this arrangement, since the PBS 533 is configured in such a manner that B light and R light are converted into P-polarized light, both of the B light and the R light are transmitted through the PBS 533.

The G light transmitted through the PBS 525 is transmitted through a PBS 534. Thereafter, merely a light component of the G light corresponding to the pixel position in an on-state is reflected on the PBS 534 for incidence onto the PBS 533 by reciprocating movement of light between a quarter wavelength plate 535 and a reflective liquid crystal panel 536. Since the G light is incident onto the PBS 533 as S-polarized light, the G light is reflected on the PBS 533.

As described above, the B light, the R light, and the G light that have been modulated by the liquid crystal panels 529, 531, 536 are combined by passing through the PBS 533. Then, after the polarization direction of the B light is rotated by 90 degrees by a half wavelength plate 537 having wavelength selectivity, color image light is incident onto the projection lens 518 via a polarizer 538, and enlarged and projected on a screen by the projection lens 518.

The embodiments of the present invention have been described as above, but the present invention is not limited to the foregoing embodiments. Also, the embodiments of the present invention may be changed or modified in various ways other than the above.

For instance, in the foregoing embodiment(s), the positive electrode of the semiconductor laser element is mounted on the substrate. Alternatively, the negative electrode of the semiconductor laser element may be mounted on the substrate. In the foregoing embodiment(s), laser light in the longer beam axis direction is converted into parallel light by a cylindrical lens. Alternatively, an additional cylindrical lens may be provided to convert the laser light in a direction of the shorter axis of beam into parallel light, as well as in the longer beam axis direction. Further alternatively, laser light may be converted into parallel light by an optical element other than the cylindrical lens. For instance, laser light may be converted into parallel light by using at least one of a condenser lens, a cylindrical lens, a refractive index distribution lens, and a diffraction element; or combination thereof.

The embodiments of the present invention may be changed or modified according to needs, as far as such changes and modifications do not depart from the scope of the present invention hereinafter defined.

What is claimed is:

1. A light source module, comprising:
 a first light emission unit including a first laser light source, and a first cooling part on which the first laser light source is mounted;
 a second light emission unit including a second laser light source, and a second cooling part on which the second laser light source is mounted; and
 an electrical insulating member provided between the first light emission unit and the second light emission unit, wherein
 the first light emission unit and the second light emission unit are constructed in such a manner that the first laser light source and the second laser light source are disposed close to each other, and the first cooling part and the second cooling part are disposed away from each other, and the electrical insulating member is provided between the first laser source and the second laser source.

2. The light source module according to claim 1, wherein the first light emission unit and the second light emission unit are each constructed in such a manner that multiple laser elements are arranged in an array.

3. An illumination device, comprising:
a light source module including:
- a first light emission unit having a first laser light source, and a first cooling part on which the first laser light source is mounted;
- a second light emission unit having a second laser light source, and a second cooling part on which the second laser light source is mounted; and
- an electrical insulating member provided between the first light emission unit and the second light emission unit, wherein
- the first light emission unit and the second light emission unit are constructed in such a manner that the first laser light source and the second laser light source are disposed close to each other, and the first cooling part and the second cooling part are disposed away from each other, and
- the electrical insulating member is provided between the first laser source and the second laser source.

4. The illumination device according to claim 3, further comprising an optical element for converting laser light to be emitted from the first laser light source and laser light to be emitted from the second laser light source into parallel light at least in one direction.

5. The illumination device according to claim 3, wherein the first light emission unit and the second light emission unit are each constructed in such a manner that multiple laser elements are arranged in an array.

6. A projection display device, comprising:
- an illumination device;
- an imager for modulating light to be emitted from the illumination device in accordance with a video signal;
- a light guiding optical system for guiding the light to be emitted from the illumination device to the imager; and
- a projection optical system for enlarging and projecting the light modulated by the imager on a projection plane,
the illumination device including a light source module having:
  - a first light emission unit provided with a first laser light source, and a first cooling part on which the first laser light source is mounted;
  - a second light emission unit provided with a second laser light source, and a second cooling part on which the second laser light source is mounted; and
  - an electrical insulating member provided between the first light emission unit and the second light emission unit, wherein
  - the first light emission unit and the second light emission unit are constructed in such a manner that the first laser light source and the second laser light source are disposed close to each other, and the first cooling part and the second cooling part are disposed away from each other, and
  - the electrical insulating member is provided between the first laser source and the second laser source.

7. The projection display device according to claim 6, wherein
the illumination device includes an optical element for converting laser light to be emitted from the first laser light source and laser light to be emitted from the second laser light source into parallel light at least in one direction.

8. The projection display device according to claim 6, wherein
the first light emission unit and the second light emission unit are each constructed in such a manner that multiple laser elements are arranged in an array.

9. An illumination device, comprising:
- a first light emission unit including a first laser light source, and a first cooling part on which the first laser light source is mounted;
- a second light emission unit including a second laser light source, and a second cooling part on which the second laser light source is mounted, the second laser light source being disposed close to the first laser light source, and the second cooling part being disposed away from the first cooling part;
- an electrical insulating member provided between the first light emission source and the second light emission source;
- a first cylindrical lens for converging laser light to be emitted from the first laser light source in a longer beam axis direction for conversion into parallel light; and
- a second cylindrical lens for converging laser light to be emitted from the second laser light source in a longer beam axis direction for conversion into parallel light.

10. The illumination device according to claim 9, wherein the electrical insulating member is mounted on both or one of the first light emission unit and the second light emission unit.

* * * * *